(12) United States Patent
Lim et al.

(10) Patent No.: US 9,935,100 B2
(45) Date of Patent: Apr. 3, 2018

(54) POWER RAIL INBOUND MIDDLE OF LINE (MOL) ROUTING

(71) Applicant: QUALCOMM Incorporated, San Diego, CA (US)

(72) Inventors: Hyeokjin Bruce Lim, San Diego, CA (US); Zhengyu Duan, San Diego, CA (US); Qi Ye, San Diego, CA (US); Mickael Malabry, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/936,459

(22) Filed: Nov. 9, 2015

(65) Prior Publication Data

US 2017/0133365 A1    May 11, 2017

(51) Int. Cl.
| | |
|---|---|
| *H01L 27/088* | (2006.01) |
| *H01L 23/522* | (2006.01) |
| *H01L 23/528* | (2006.01) |
| *H01L 27/02* | (2006.01) |
| *H01L 29/45* | (2006.01) |
| *G06F 17/50* | (2006.01) |
| *H01L 21/768* | (2006.01) |
| *H01L 21/8238* | (2006.01) |

(52) U.S. Cl.
CPC ........ *H01L 27/088* (2013.01); *G06F 17/5072* (2013.01); *H01L 21/76895* (2013.01); *H01L 21/823821* (2013.01); *H01L 23/522* (2013.01); *H01L 23/528* (2013.01); *H01L 23/5226* (2013.01); *H01L 23/5286* (2013.01); *H01L 27/0207* (2013.01); *H01L 29/45* (2013.01)

(58) Field of Classification Search
CPC ......... H01L 27/11519; H01L 27/11568; H01L 27/11565; H01L 27/11521; H01L 23/52; H01L 27/0207; H01L 27/105; H01L 27/1104; H01L 27/1116; H01L 2924/0002; H01L 2924/00; Y10S 257/903
See application file for complete search history.

(56) References Cited

U.S. PATENT DOCUMENTS

| | | | |
|---|---|---|---|
| 7,791,109 | B2 | 9/2010 | Wann et al. |
| 8,569,129 | B2 | 10/2013 | Ma et al. |
| 8,581,348 | B2 | 11/2013 | Rashed et al. |
| 8,618,607 | B1 | 12/2013 | Rashed et al. |

(Continued)

OTHER PUBLICATIONS

International Search Report and Written Opinion—PCT/US2016/056472—ISA/EPO—dated Jan. 16, 2017.

*Primary Examiner* — Fernando L Toledo
*Assistant Examiner* — Lawrence-Linh T Nguyen
(74) *Attorney, Agent, or Firm* — Loza & Loza, LLP/Qualcomm

(57) ABSTRACT

In certain aspects, a semiconductor die includes a power rail, a first gate, and a second gate. The semiconductor die also includes a first gate contact electrically coupled to the first gate, wherein the first gate contact is formed from a first middle of line (MOL) metal layer, and a second gate contact electrically coupled to the second gate, wherein the second gate contact is formed from the first MOL metal layer. The semiconductor die further includes an interconnect formed from a second MOL metal layer, wherein the interconnect is electrically coupled to the first and second gate contacts, and at least a portion of the interconnect is underneath the power rail.

15 Claims, 16 Drawing Sheets

(56) References Cited

U.S. PATENT DOCUMENTS

| | | | |
|---|---|---|---|
| 9,070,552 | B1 | 6/2015 | Shah et al. |
| 9,520,501 | B2 | 12/2016 | Koldiaev et al. |
| 9,564,211 | B2 | 2/2017 | Liaw et al. |
| 9,620,510 | B2 | 4/2017 | Liaw et al. |
| 9,627,036 | B2 | 4/2017 | Yin et al. |
| 2009/0321791 | A1 | 12/2009 | Wagner |
| 2010/0123253 | A1* | 5/2010 | Ooka .................. H01L 27/0207 257/773 |
| 2012/0074467 | A1* | 3/2012 | Abe .................. H01L 27/11519 257/208 |
| 2012/0119302 | A1* | 5/2012 | Pei .................... H01L 21/76879 257/382 |
| 2013/0093022 | A1 | 4/2013 | Choi |
| 2013/0126978 | A1 | 5/2013 | Becker et al. |
| 2013/0146986 | A1 | 6/2013 | Rashed et al. |
| 2016/0036219 | A1 | 2/2016 | Campi, Jr. et al. |

\* cited by examiner

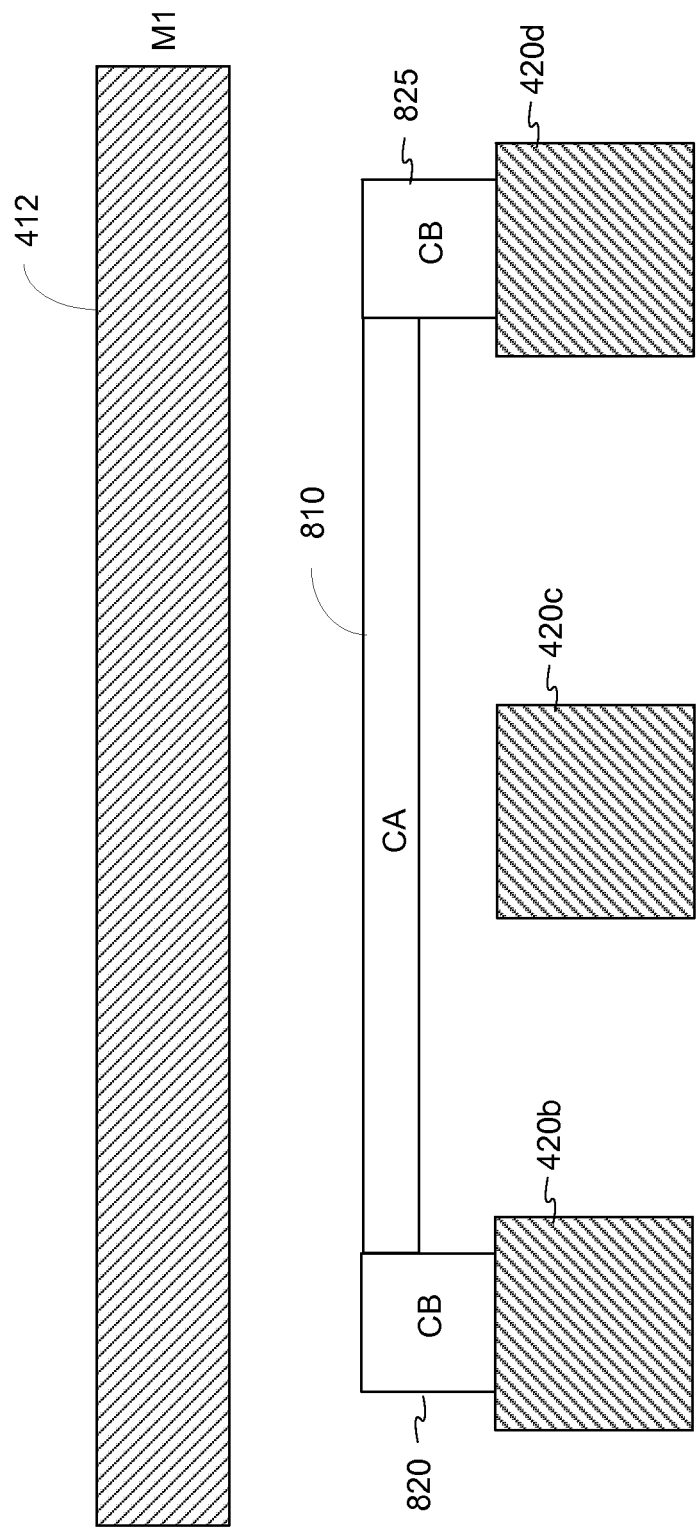

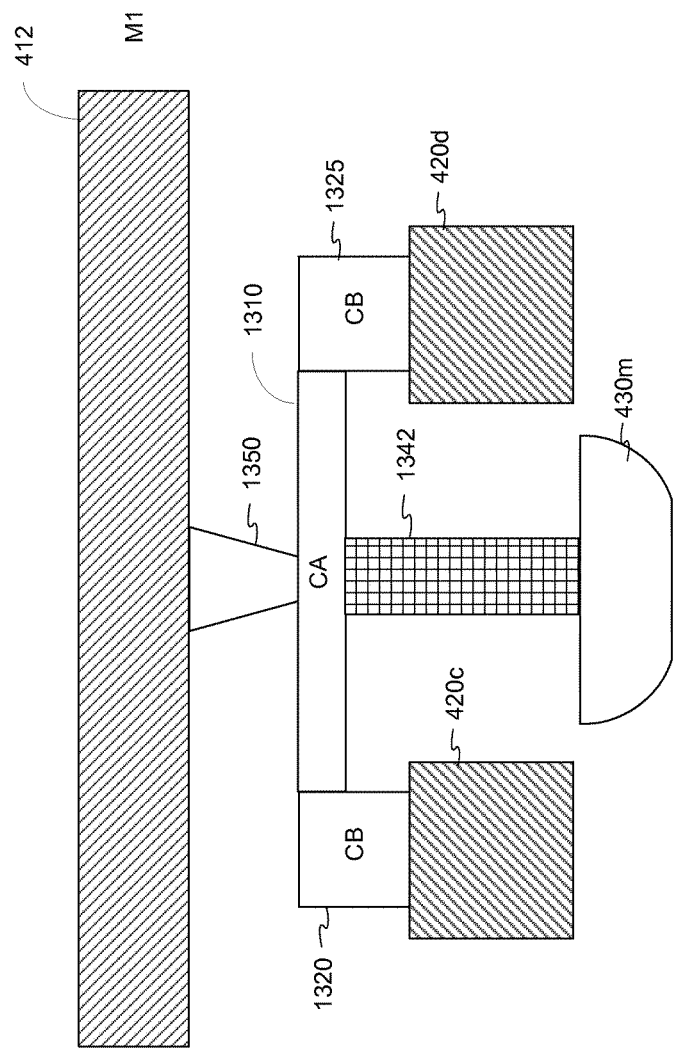

POWER RAIL INBOUND MIDDLE OF LINE (MOL) ROUTING

BACKGROUND

Field

Aspects of the present disclosure relate generally to routing on a die, and more particularly, to middle of line (MOL) routing on a die.

Background

A semiconductor die may include many semiconductor devices (e.g., transistors). The semiconductor devices may be interconnected by one or more metal layers to form integrated circuits. As the dimensions of devices scale down, routing congestion on a die increases, making it more difficult to interconnect devices on the die.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to an aspect, a semiconductor die is provided. The semiconductor die includes a power rail, a first gate, and a second gate. The semiconductor die also includes a first gate contact electrically coupled to the first gate, wherein the first gate contact is formed from a first middle of line (MOL) metal layer, and a second gate contact electrically coupled to the second gate, wherein the second gate contact is formed from the first MOL metal layer. The semiconductor die further includes an interconnect formed from a second MOL metal layer, wherein the interconnect is electrically coupled to the first and second gate contacts, and at least a portion of the interconnect is underneath the power rail.

A second aspect relates to a semiconductor die. The semiconductor die includes a power rail, a gate, and a source. The semiconductor die also includes a gate contact electrically coupled to the gate, wherein the gate contact is formed from a first middle of line (MOL) metal layer. The semiconductor die also includes an interconnect formed from a second MOL metal layer, wherein the interconnect is electrically coupled to the gate contact and the source, and at least a portion of the interconnect is underneath the power rail.

A third aspect relates to a semiconductor die. The semiconductor die includes a power rail, a first cell including a first plurality of gates and a first plurality of sources/drains, and a second cell including a second plurality of gates and a second plurality of sources/drains. The semiconductor cell also includes a first gate contact electrically coupled to one of the first plurality of gates, wherein the first gate contact is formed from a first middle of line (MOL) metal layer, and a second gate contact electrically coupled to one of the second plurality of gates, wherein the second gate contact is formed from the first MOL metal layer. The semiconductor die also includes an interconnect formed from a second MOL metal layer, wherein the interconnect is electrically coupled to the first and second gate contacts, and is routed underneath the power rail.

BRIEF DESCRIPTION OF THE DRAWINGS

FIG. 9 shows a side view of the interconnect in FIGS. 8A and 8B according to certain aspects of the present disclosure.

FIG. 14 shows a side view of the interconnect in FIGS. 13A and 13B according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
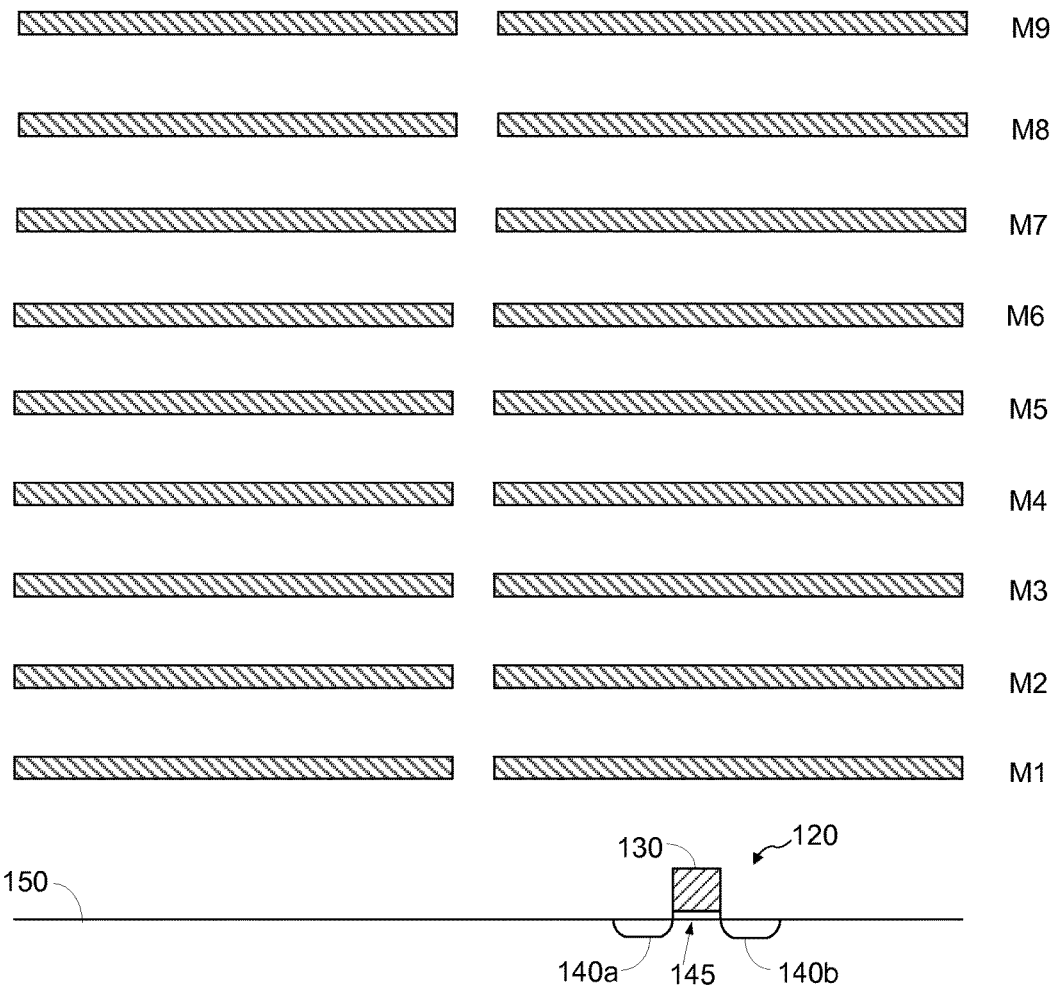
FIG. 1 shows a side view of an exemplary semiconductor die according to certain aspects of the present disclosure.

FIG. 1 shows a simplified example of a semiconductor die (chip) 110. The semiconductor die 110 includes multiple interconnect metal layers, in which adjacent interconnect metal layers are separated by one or more insulating layers. The different interconnect metal layers may be interconnected using vias and/or other structures, which are not shown in FIG. 1 for ease of illustration. The bottom-most interconnect metal layer is labeled M1. The interconnect metal layer immediately above interconnect metal layer M1 is labeled M2, the interconnect metal layer immediately above metal layer M2 is labeled M3, and so forth. In this example, the semiconductor die 110 includes nine interconnect metal layers labeled M1-M9.

The interconnect metal layers M1-M9 are used to couple various components of the die to one another, to one or more off-die devices, and/or to one or more power supplies. Typically, metal layer M1 is formed over semiconductor devices (e.g., transistors) on the die, and is coupled to the semiconductor devices using contact structures, as discussed further below. Metal layer M1 may be used to provide power rails for semiconductor devices on the die, to couple semiconductor devices on the die to one another, and/or to couple semiconductor devices on the die to higher metal layers. In this regard, FIG. 1 shows an example of a transistor 120 (e.g., field effect transistor) under metal layer M1. The transistor 120 is formed on a substrate 150 of the die before the metals M1-M9 are deposited over the transistor 120. The transistor 120 includes a gate 130, a first source/drain 140a, and a second source/drain 140b. The gate 130 may include polysilicon and/or other material. As used herein, the term "source/drain" indicates that the corresponding structure can act as a source or a drain. Although one transistor 120 is shown in FIG. 1 for ease of illustration, it is to be appreciated the semiconductor die 110 includes many transistors. It is also to be appreciated that FIG. 1 is not drawn to scale, and that the thicknesses of the metal layers M1-M9 and the spaces between adjacent metal layers may vary on the die.

The transistor 120 may be formed on the die using a planar process or a FinFET process. FIG. 1 shows an example in which the transistor 120 is formed using a planar process. In this example, the transistor 120 includes a gate dielectric 145 (e.g., gate oxide) between the gate and channel of the transistor. For a transistor formed using a FinFET process (not shown), the transistor may include one or more fins between the first source/drain and second source/drain to form the channel of the transistor, and a gate formed over the fins. In either case, a transistor includes a gate, a first source/drain, and a second source/drain. Accordingly, it is to be appreciated that aspects of the present disclosure are applicable to transistors formed using planar processes and FinFET processes.

Figure 2:
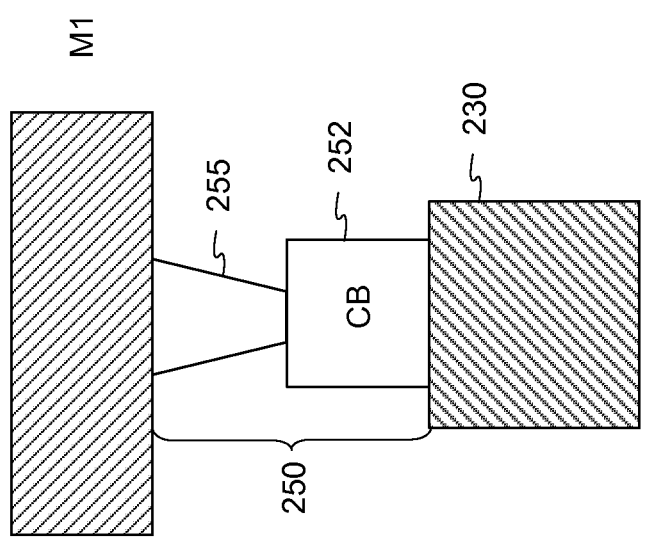
FIG. 2 shows a side view of an exemplary structure for coupling a gate to a metal layer according to certain aspects of the present disclosure.

FIG. 2 shows an exemplary contact structure 250 for coupling a gate 230 of a transistor (e.g., transistor 120) to metal layer M1. In this example, the contact structure 250 is disposed between the gate 230 and metal layer M1, and electrically couples the gate 230 to metal layer M1. The contact structure 250 includes a gate contact 252 formed from a first middle of line (MOL) metal layer (denoted "CB" in FIG. 2). As used herein, the term "MOL" refers to a layer under metal layer M1. The first MOL metal layer (CB) may include tungsten, copper and/or other conductive material. The gate contact 252 may make contact with the top of the gate 230, as shown in FIG. 2. The contact structure 250 also includes a via 255 disposed between the gate contact 252 and metal layer M1. The via 255 electrically couples the gate contact 252 to metal layer M1.

Figure 3:
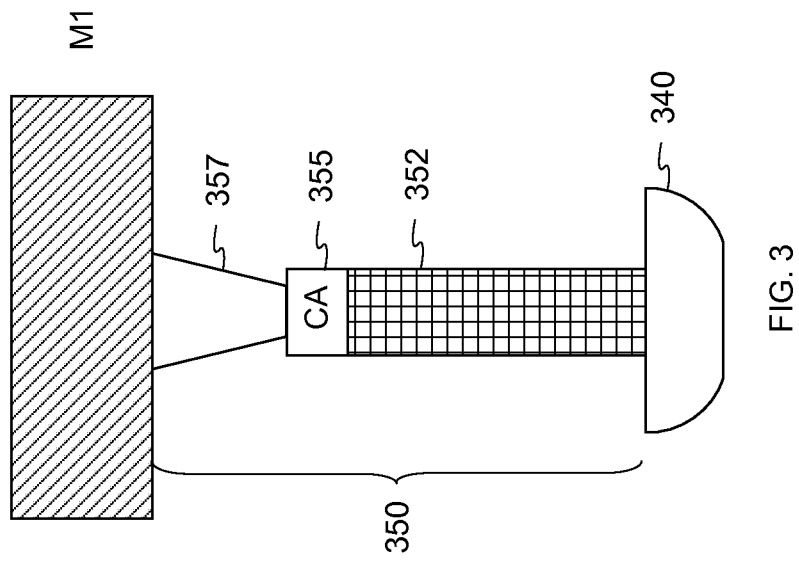
FIG. 3 shows a side view of an exemplary structure for coupling a source/drain to a metal layer according to certain aspects of the present disclosure.

FIG. 3 shows an exemplary contact structure 350 for coupling a source/drain 340 of a transistor (e.g., transistor 120) to metal layer M1. In this example, the contact structure 350 is disposed between the source/drain 340 and metal layer M1, and electrically couples the source/drain to metal layer M1. The contact structure 350 includes a first source/drain contact 352 formed on top of the source/drain 340. The first source/drain contact 352 may be formed from a trench silicide (TS) layer. In this example, the first source/drain contact 352 may be formed by etching a trench in a dielectric material and filling the trench with a silicide material. The contact structure 350 also includes a second source/drain contact 355 formed from a second MOL metal layer (denoted "CA" in FIG. 3). The second MOL metal layer (CA) may include tungsten, copper and/or other conductive material. The second source/drain contact 355 is stacked on top of the first source/drain contact 352 in the example in FIG. 2. The contact structure 350 further includes a via 357 disposed between the second source/drain contact 355 and metal layer M1. The via 357 electrically couples the second source/drain contact 355 to metal layer M1. The vias 255 and 357 in FIGS. 2 and 3 may be formed from the same conductive layer.

Thus, the first and second MOL metal layers (CB and CA) are conventionally used to couple the gates and sources/drains, respectively, to metal layer M1 and/or other upper metal layers. The first and second MOL metal layers (CB and CA) are not conventionally used to form a global feature. As used herein, a "global feature" may refer to a structure that is shared by multiple cells. An example of a global feature is a power rail formed from metal layer M1, as discussed further below.

Figure 4:
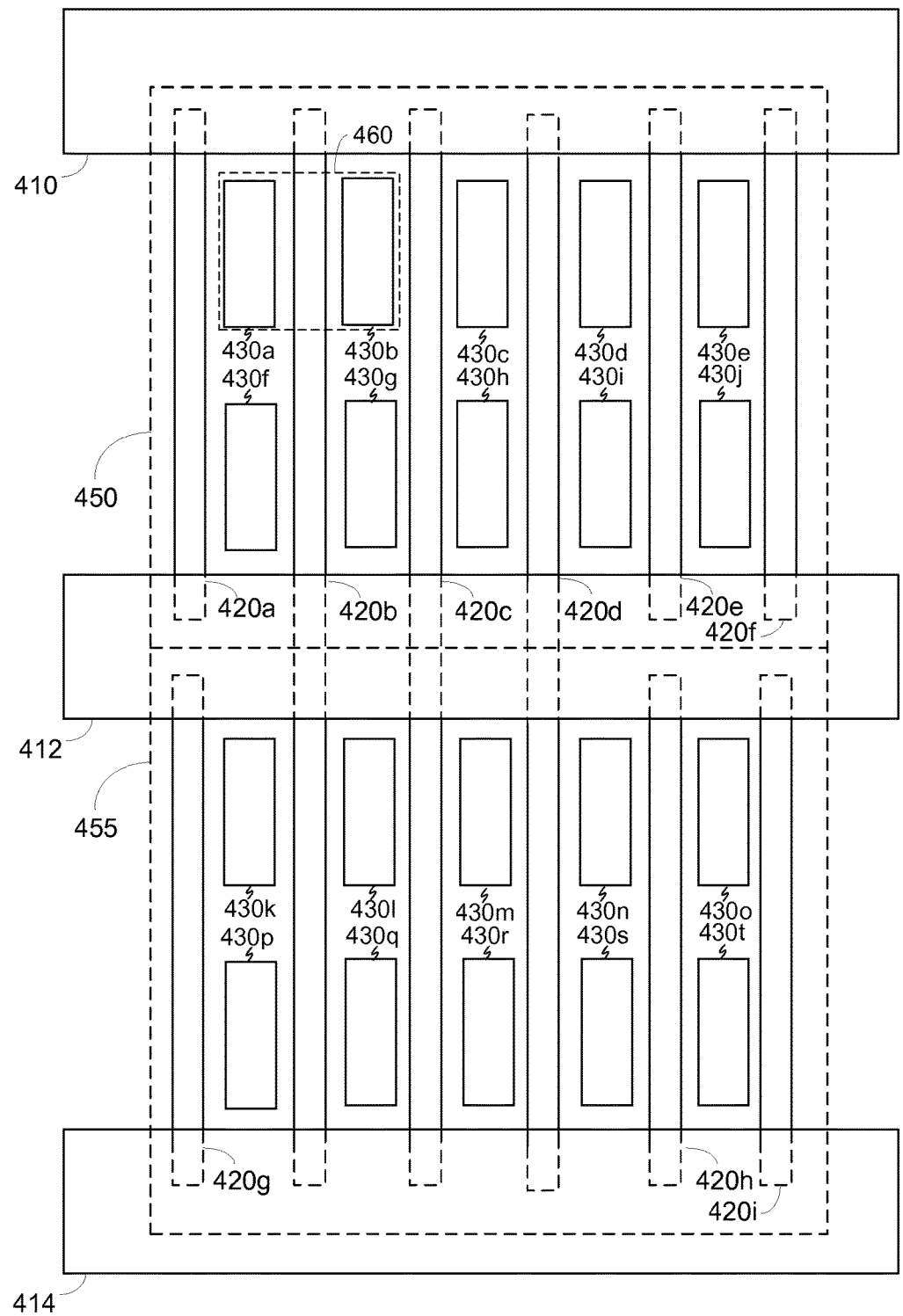
FIG. 4 shows a top view of an exemplary semiconductor die according to certain aspects of the present disclosure.

FIG. 4 shows an exemplary top view of the die 110 with metal layers M2-M9 removed for ease of illustration. In this example, the die 110 includes a first power rail 410 formed from metal layer M1, a second power rail 412 formed from metal layer M1, and a third power rail 414 formed from metal layer M1. The power rails 412 may be formed from metal layer M1 using any metal etching process known in the art. The first and third power rails 410 and 414 may have a supply voltage of Vdd and the second power rail 412 may have a supply voltage of Vss, in which Vdd may be a positive voltage and Vdd may be approximately zero volts (e.g., ground) or another voltage lower than Vdd. Alternatively, the first and third power rails 410 and 414 may have a supply voltage of Vss and the second power rail 412 may have a supply voltage of Vdd. It is to be appreciated that each of the power rails 410, 412 and 414 may be longer than shown in FIG. 4. In FIG. 4, structures under the power rails 410, 412 and 414 are shown in dashed lines.

The die includes a first cell 450 and a second cell 455. In the example in FIG. 4, a boundary between the first and second cells 450 and 455 lies under the second power rail 412, although it is to be appreciated that this need not be the case. It is to be appreciated that the die may include many more cells than shown in FIG. 4.

The first cell 450 includes multiple gates 420a-420f (e.g., polysilicon gates) and multiple sources/drains 430a-430j, which form multiple transistors within the first cell 450. In this regard, FIG. 4 shows an example of a transistor 460 formed from gate 420b, source/drain 430a and source/drain 430b. In the example in FIG. 4, the gates 420a-420f are elongated and arranged in parallel with one or more sources/drains between adjacent gates. For the example in which the gates 420a-420f include polysilicon, the gates may be referred to as poly conductors (PCs).

The transistors within the first cell 450 may be interconnected by local interconnects (not shown in FIG. 4) to form an integrated circuit that performs one or more functions. For example, the transistor may be interconnected to form a circuit that performs a logic function (AND gate, OR gate, XOR gate, etc.), a circuit that performs a storage function (flip-flop, latch, etc.), a circuit that performs a multiplexing function (e.g., multiplexer), etc. The transistors within the first cell 450 may be powered by the first and second power rails 410 and 412, which provide voltages Vdd and Vss, as discussed above. In this regard, one or more of the transistors within the first cell 450 may be coupled to the power rails by one or more contact structures (e.g., contact structures 250 and 350 shown in FIGS. 2 and 3).

The second cell 455 includes multiple gates 420b-420d, 420g, 420h and 420i (e.g., polysilicon gates) and multiple sources/drains 430k-430t, which form multiple transistors within the second cell 455. In the example shown in FIG. 4, gates 420b-420d in the first cell 450 extend underneath the second power rail 412 into the second cell 455. In the example in FIG. 4, the gates 420b-420d, 420g, 420h and 420i are elongated and arranged in parallel with one or more sources/drains between adjacent gates.

The transistors within the second cell 455 may be interconnected by local interconnects (not shown in FIG. 4) to form an integrated circuit that performs one or more functions (e.g., any of the functions discussed above). The transistors within second cell 455 may be powered by the second and third power rails 412 and 414, which provide voltages Vdd and Vss, as discussed above. In this regard, one or more of the transistors within the second cell 455 may be coupled to the power rails by one or more contact structures (e.g., contact structures 250 and 350 shown in FIGS. 2 and 3).

Figure 5:
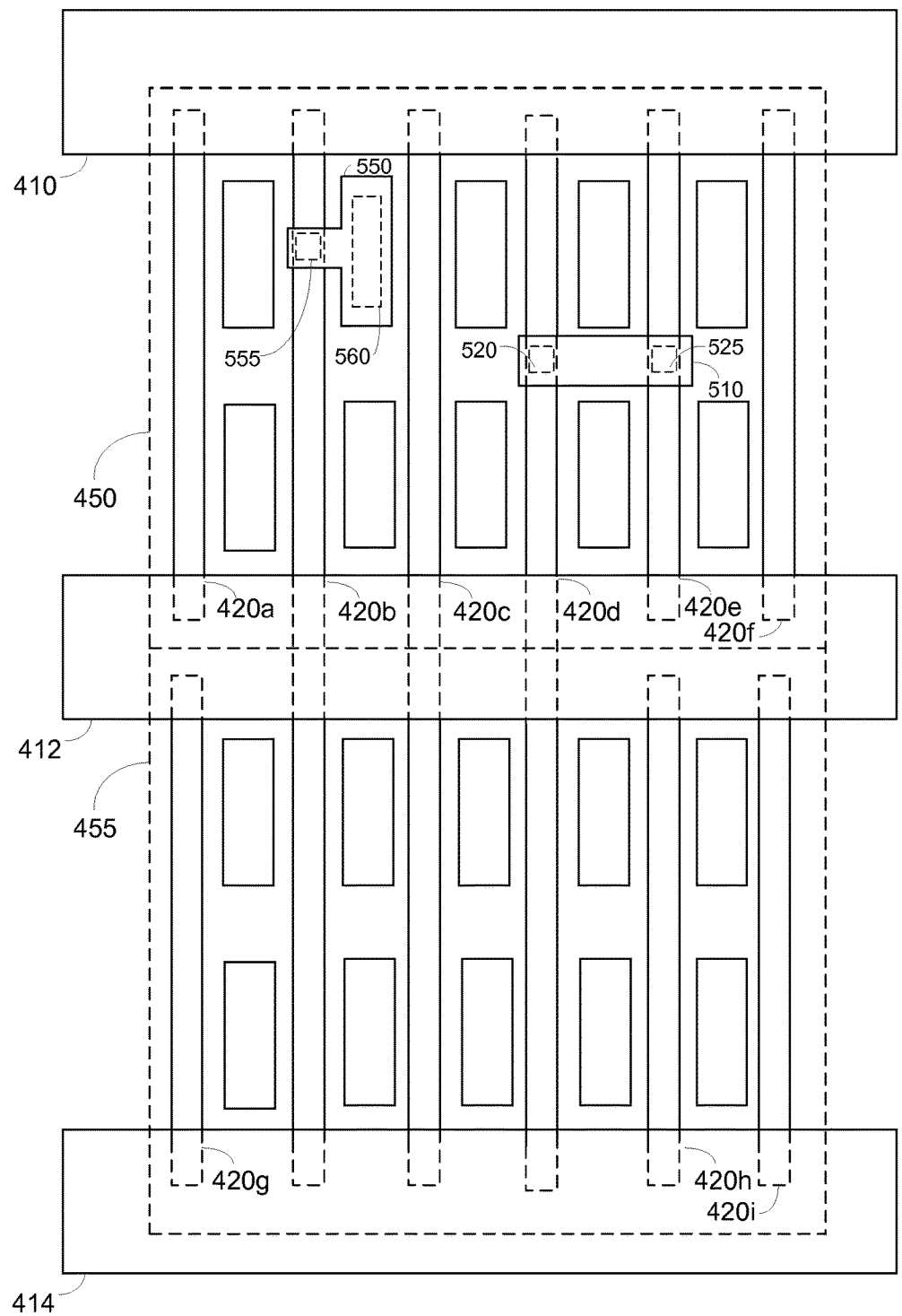
FIG. 5 shows exemplary local interconnects formed from metal layer M1 according to certain aspects of the present disclosure.

As discussed above, transistors in a cell may be interconnected to form a circuit. In this regard, FIG. 5 shows an example of a first local interconnect 510 and a second local interconnect 550 in the first cell 450, where each local interconnect is formed from metal layer M1. For ease of illustration, the references numbers for the sources/drains 430a-430t shown in FIG. 4 are omitted from FIG. 5.

Figure 6A:
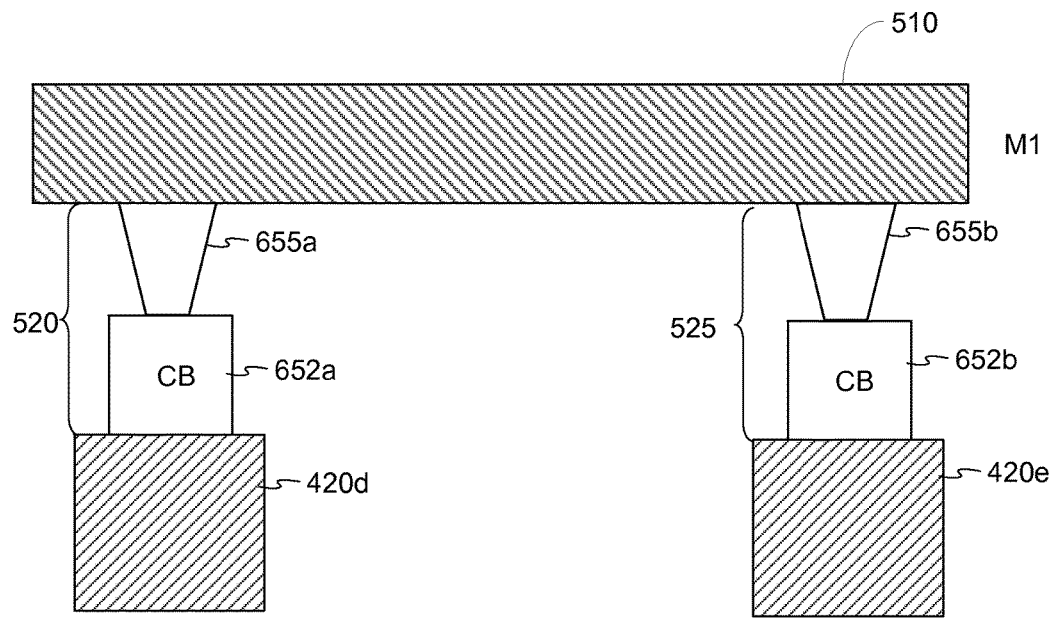
FIGS. 6A and 6B show side views of the exemplary local interconnects in FIG. 5 according to certain aspects of the present disclosure.

In this example, the first local interconnect 510 couples gates 420d and 420e, in which the first local interconnect 510 is coupled to gate 420d by a first contact structure 520 and is coupled to gate 420e by a second contact structure 525. In this regard, FIG. 6A shows a side view of the first local interconnect 510, in which the first contact structure 520 includes a first gate contact 652a and a first via 655a, and the second contact structure 520 includes a second gate contact 652b and a second via 655b.

Figure 6B:
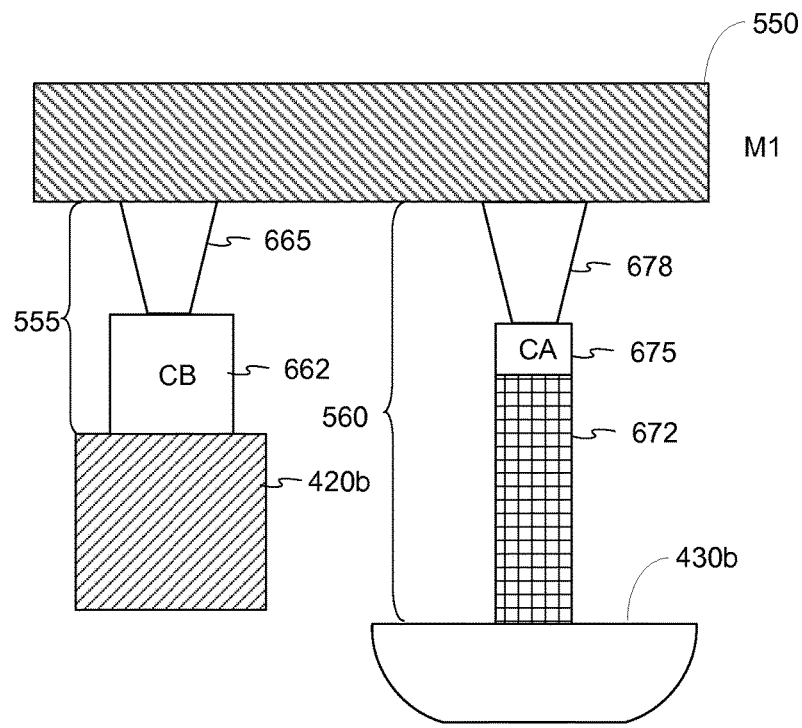

Returning to FIG. 5, the second local interconnect 550 couples gate 420b and source/drain 430b, in which the second local interconnect 550 is coupled to gate 420d by a third contact structure 555 and is coupled to source/drain 430b by a fourth contact structure 560. In this regard, FIG. 6B shows a side view of the second local interconnect 550, in which the third contact structure 555 includes a gate contact 662 and a first via 665, and the fourth contact structure 560 includes a first source/drain contact 672 (e.g., TS), a second source/drain contact 675, and a second via 678.

In general, metal layer M1 may be used to form local interconnects that interconnect gates, interconnect one or more gates to one or more sources/drains, interconnect sources/drains, etc. Thus, metal layer M1 may be patterned to form local interconnects that interconnect the transistors in a cell to form a circuit. As discussed further below, metal layer M1 can also be used to form global interconnects between two or more cells.

Figure 7:
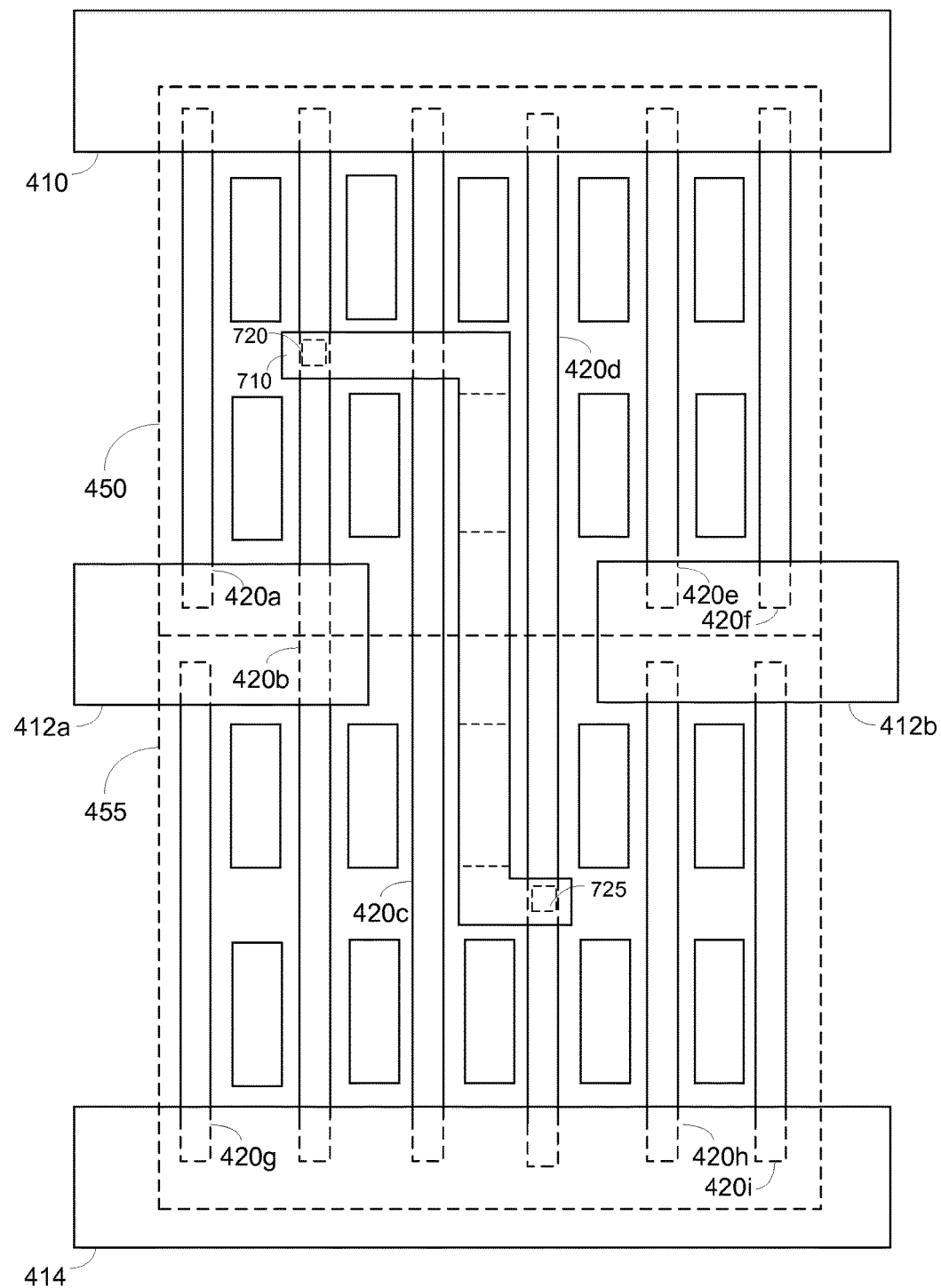
FIG. 7 shows a top view of an exemplary interconnect formed from metal layer M1 and used for routing between cells according to certain aspects of the present disclosure.

FIG. 7 shows an example in which metal layer M1 is used to form an interconnect 710 that couples transistors in the first and second cells 450 and 455. In this example, the interconnect 710 is coupled to gate 420b in the first cell 450 by a first contact structure 720, and to gate 420d in the second cell 455 by a second contact structure 725. Each of the first and second contact structures 720 and 725 may include the contact structure 250 shown in FIG. 2. As shown in FIG. 7, the interconnect 710 provides routing between the first and second cells 450 and 455. Thus, metal layer M1 can be used for both local routing and global routing.

However, a drawback with using metal layer M1 for the interconnect 710 is that it requires a break in the second power rail 412 to pass through the second power rail 412, as shown in FIG. 7. This is because the interconnect 710 and the second power rail 412 are formed from the same metal layer (i.e., metal layer M1. In the example in FIG. 7, the second power rail 412 is broken into a first portion 412a and a second portion 412b to accommodate the interconnect 710. The break in the power rail causes power integrity degradation, which may cause time-sensitive circuits to malfunction. The power integrity degradation may include increased IR voltage drops in the power network and/or electromagnetic emissions. Another drawback is that the interconnect 710 occupies a significant area, causing metal routing congestion.

In general, metal layer M1 routing is limited when it conflicts with a structure formed from metal layer M1 such as a power rail (e.g., the second power rail 412). In this case, either the metal layer M1 routing has be routed around the structure (which may not be possible in many cases) or the structure has to be broken to allow the metal layer M1 routing to pass through (which may cause one or more of the problems discussed above).

Aspects of the present disclosure provide routing using the first and second MOL metal layers (CA and CB) that avoid one or more of the above drawbacks, as discussed further below.

Figure 8A:
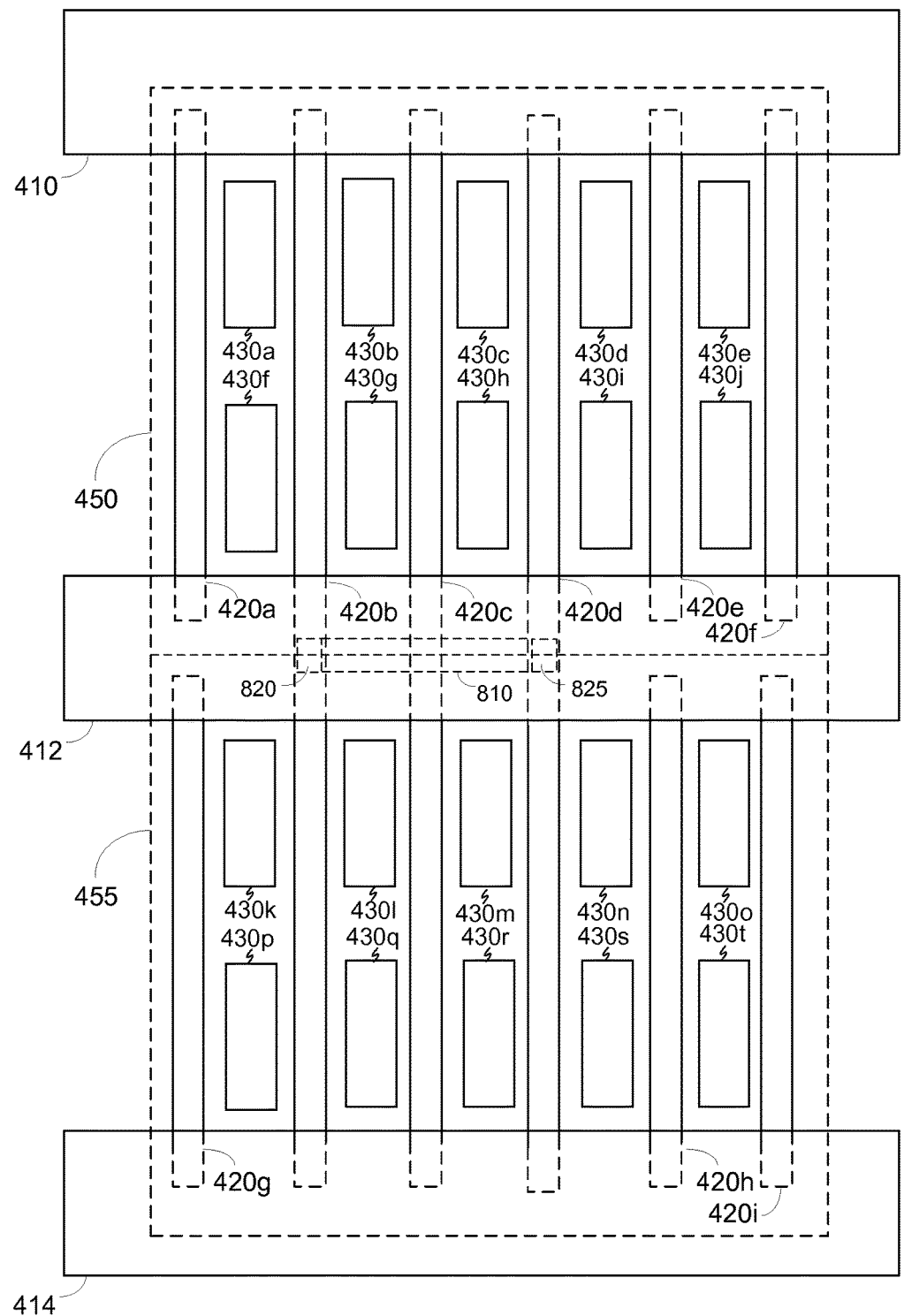
FIGS. 8A and 8B show top views of an exemplary interconnect providing routing under a metal M1 power rail according to certain aspects of the present disclosure.
Figure 8B:
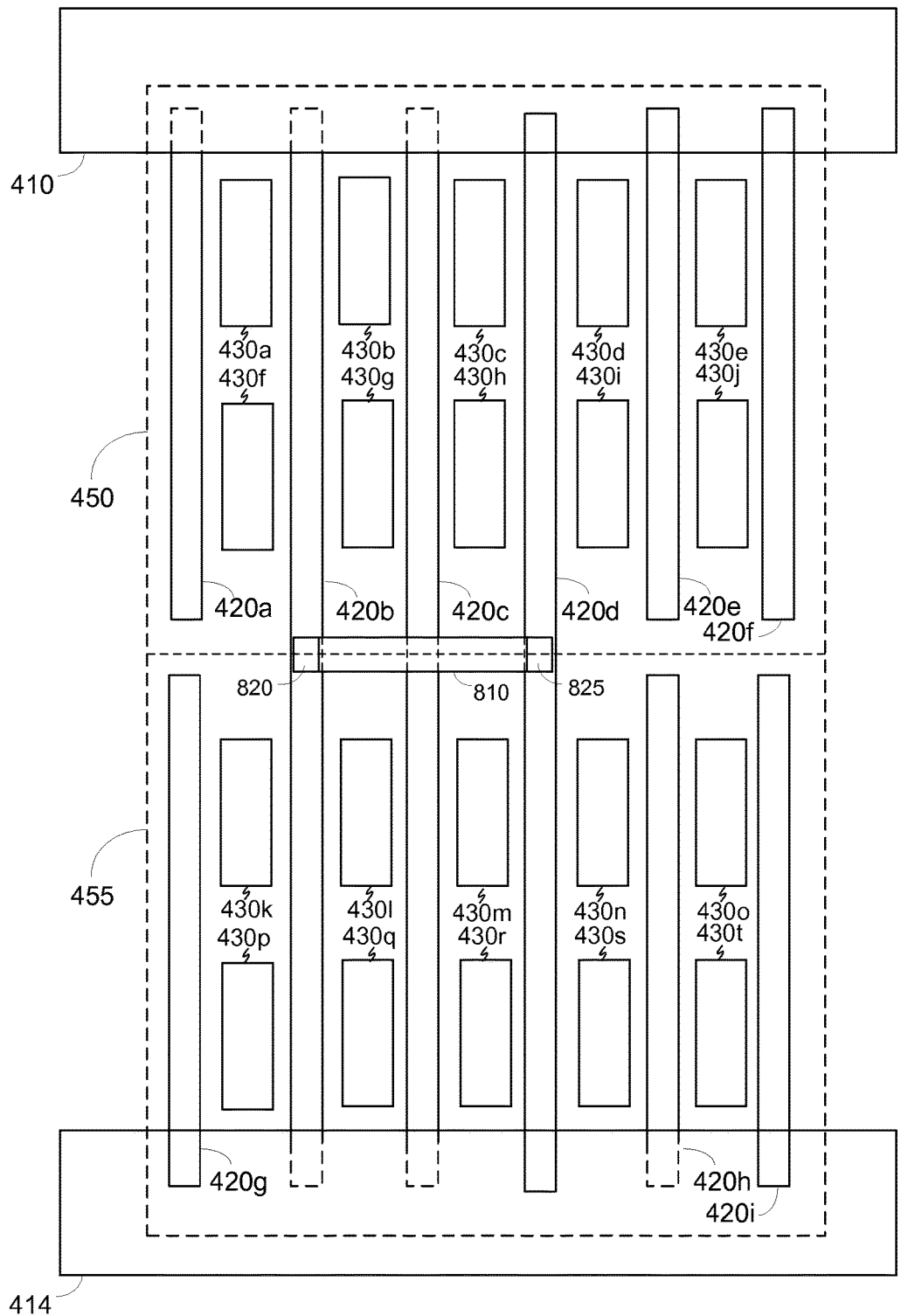

FIGS. 8A and 8B show top views of an exemplary interconnect 810 according to certain aspects of the present disclosure. FIG. 8A shows the interconnect 810 with the second power rail 412, and FIG. 8B shows the interconnect 810 with the second power rail 412 removed to provide an unobstructed view of the interconnect 810. FIG. 9 shows a side view of the interconnect 810.

The interconnect 810 provides routing between gate 420b and gate 420d underneath the second power rail 412. The interconnect 810 is formed from the second MOL metal layer (CA), which is the same metal layer used to form source/drain contacts (e.g., source/drain contacts 355), as discussed above. As shown in FIG. 9, the interconnect 810 extends between and makes contact with gate contacts 820 and 825 on gates 420b and 420d, respectively. In this respect, the interconnect 810 acts as an electrical bridge between the gate contacts 820 and 825. In the example in FIG. 9, the interconnect 810 makes contact with sidewalls of the gate contacts 820 and 825.

Thus, the interconnect 810 (which is formed from the second MOL metal layer (CA)) and gate contacts 820 and 825 (which are formed from the first MOL metal layer (CB)) electrically couple gates 420b and 420d. Since the first MOL metal layer (CA) and the second MOL metal layer (CB) are formed at lower levels than metal layer M1, the interconnect 810 and gate contacts 820 and 825 are able to provide routing between gates 420b and 420d under the second power rail 412. Consequently, there is no need to break the second power rail 412. As shown in FIGS. 8A and 9, the second power rail 412 is continuous with no breaks. Further, since the interconnect 810 and gate contacts 820 and 825 are underneath metal layer M1, they do not interfere with metal layer M1, and therefore reduce routing congestion. As a result, area efficiency is improved.

Thus, aspects of the present disclosure provide MOL routing (e.g., between transistors) using the first and second MOL metal layers (CB and CA). Since the first and second MOL metal layers (CB and CA) are formed at lower levels than metal layer M1, MOL routing is not subject to the same restrictions as metal layer M1 routing. For instance, MOL routing can cross underneath a structure (e.g., power rail) formed from metal layer M1 without requiring a break in the structure. In contrast, when metal layer M1 routing conflicts with a metal layer M1 structure (e.g., power rail), the metal layer M1 routing either has be routed around the structure (which may not be possible in many cases) or the structure has to be broken to allow the metal layer M1 routing to pass through. Thus, MOL routing according to aspects of the present disclosure can advantageously be used in cases where routing using metal layer M1 would be highly restricted.

Although not explicitly shown in FIGS. 8A and 8B, it is to be appreciated that the die may also include local interconnects (e.g., local interconnects 510 and 550 as shown in FIG. 5) for interconnecting transistors in the first cell 450 and second cell 455 to form integrated circuits.

Figure 10A:
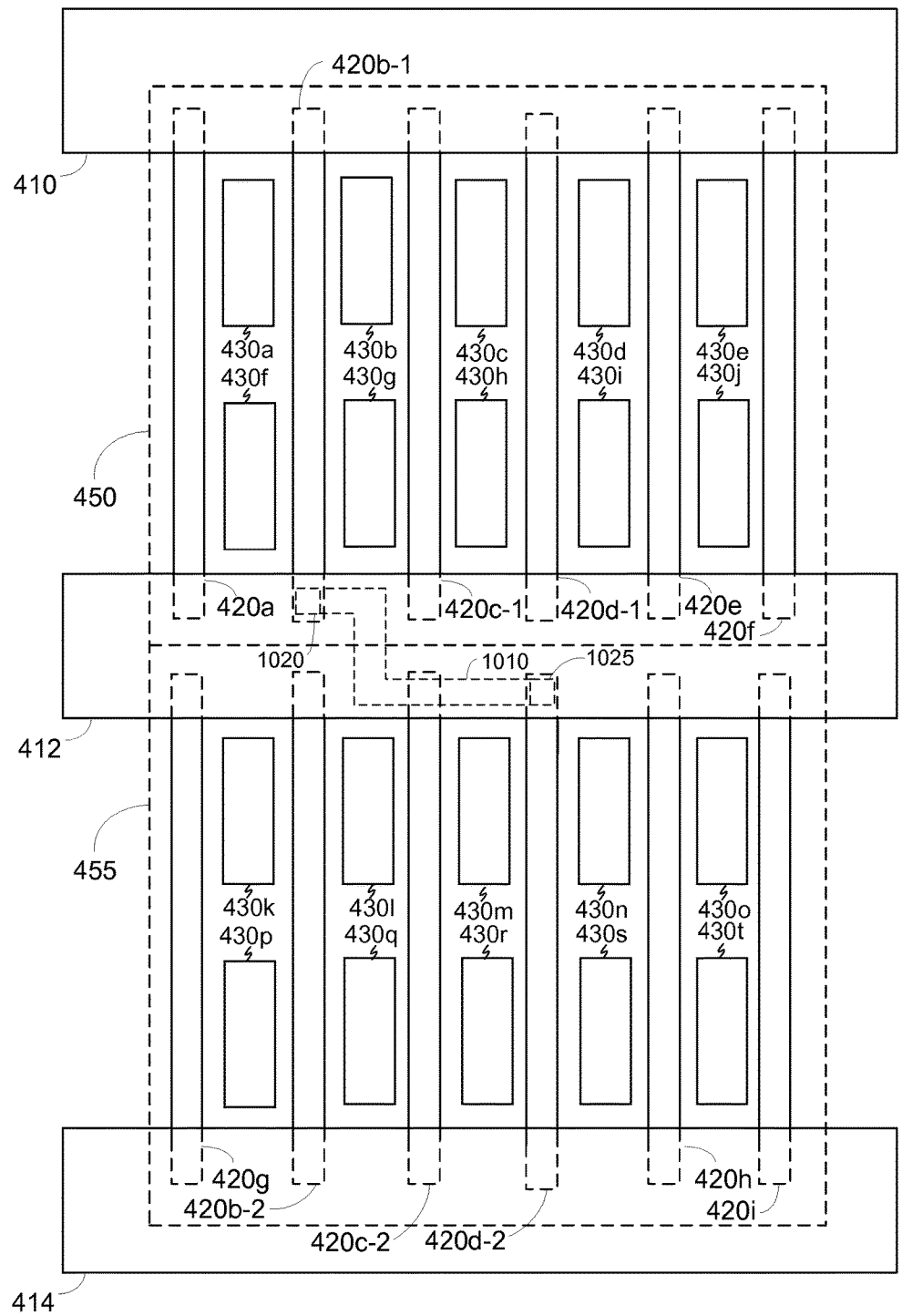
FIGS. 10A and 10B show top views of another exemplary interconnect providing routing under a metal M1 power rail according to certain aspects of the present disclosure.
Figure 10B:
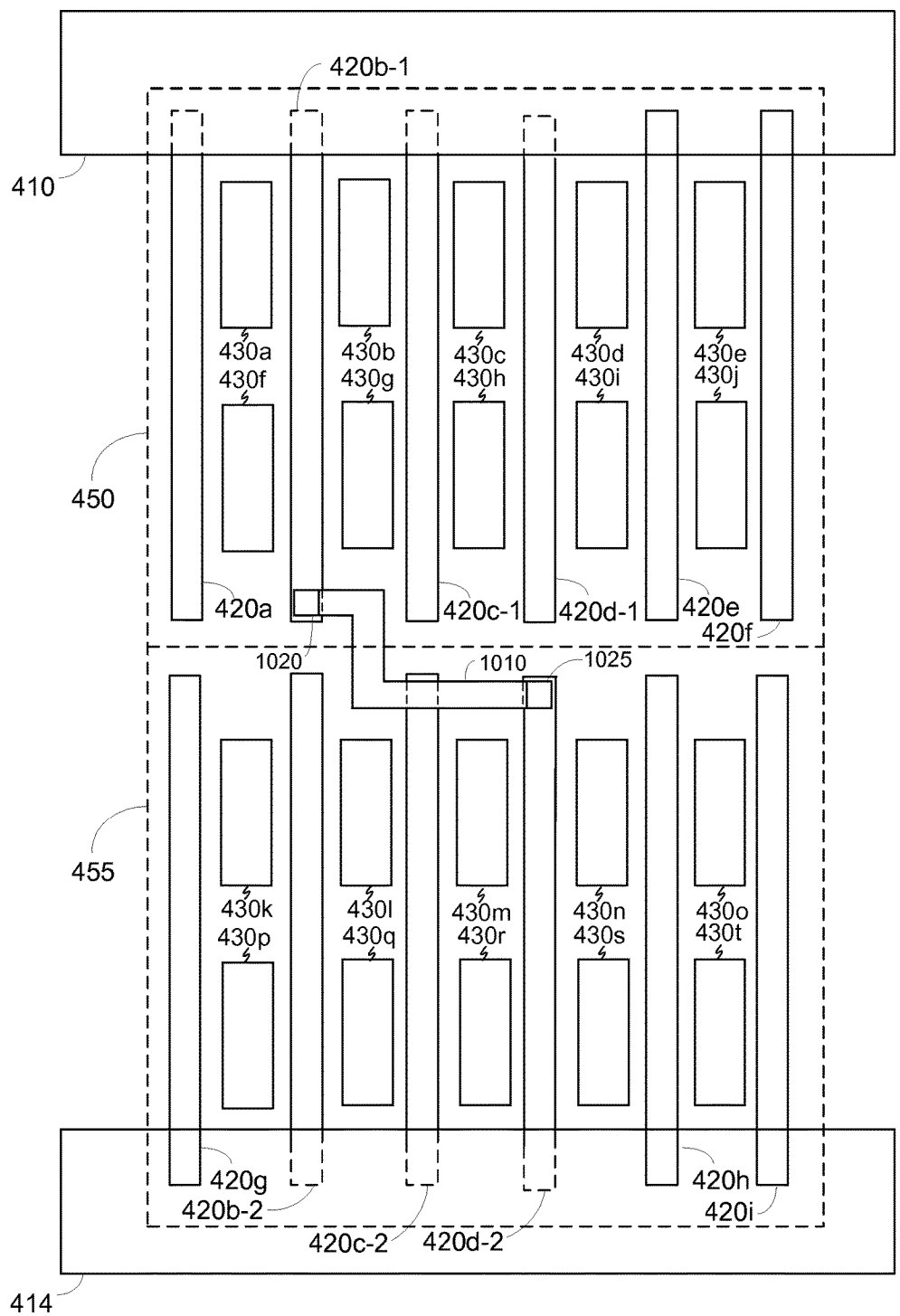
Figure 11:
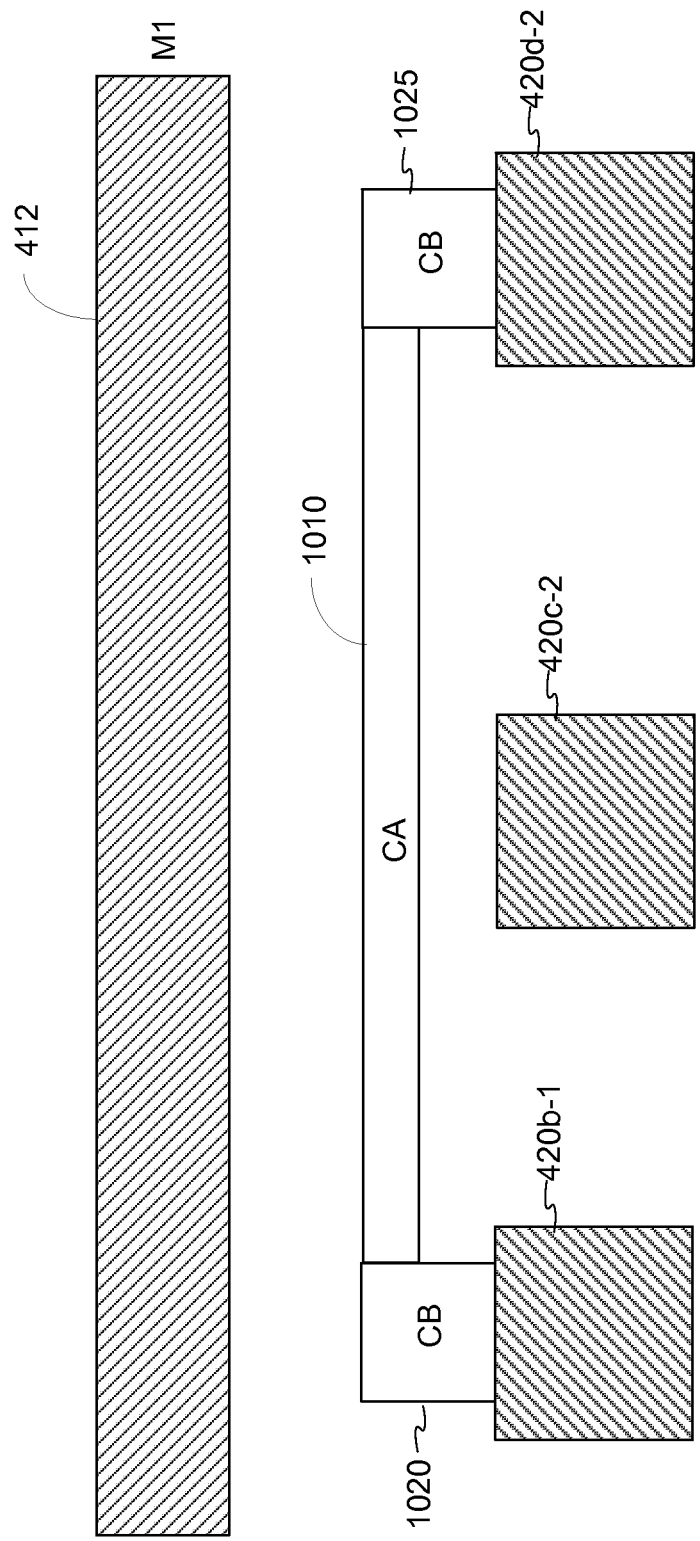
FIG. 11 shows a side view of the interconnect in FIGS. 10A and 10B according to certain aspects of the present disclosure.

FIGS. 10A and 10B show top views of another exemplary interconnect 1010 according to certain aspects of the present disclosure. FIG. 10A shows the interconnect 1010 with the second power rail 412, and FIG. 10B shows the interconnect 1010 with the second power rail 412 removed to provide an unobstructed view of the interconnect 1010. FIG. 11 shows a side view of the interconnect 1010.

In this example, gate 420*b* in FIG. 8 is broken into gate 420*b*-1 in the first cell 450 and gate 420*b*-2 in the second cell 455, gate 420*c* in FIG. 8 is broken into gate 420*c*-1 in the first cell 450 and gate 420*c*-2 in the second cell 455, and gate 420*d* in FIG. 8 is broken into gate 420*d*-1 in the first cell 450 and gate 420*d*-2 in the second cell 455.

In this example, the interconnect 1010 provides routing between gate 420*b*-1 and gate 420*d*-2 underneath the second power rail 412. The interconnect 1010 is formed from the second MOL metal layer (CA), which is the same metal layer used to form source/drain contacts (e.g., source/drain contacts 355), as discussed above. As shown in FIG. 11, the interconnect 1010 extends between and makes contact with gate contacts 1020 and 1025 on gates 420*b*-1 and 420*d*-2, respectively. In this respect, the interconnect 1010 acts as an electrical bridge between the gate contacts 1020 and 1025.

Thus, the interconnect 1010 (which is formed from the second MOL metal layer (CA)) and gate contacts 1020 and 1025 (which are formed from the first MOL metal layer (CB)) provide routing between gate 420*b*-1 in the first cell 450 and 420*d*-2 in the second cell. In the example in FIG. 11, the interconnect 1010 makes contact with sidewalls of the gate contacts 1020 and 1025. Since the first MOL metal layer (CA) and the second MOL metal layer (CB) are formed at lower levels than metal layer M1, the interconnect 1010 and gate contacts 1020 and 1025 are able to provide routing under the second power rail 412.

It is to be appreciated that aspects of the present disclosure are not limited to the particular examples discussed. In general, aspects of the present disclosure provide routing between cells under a metal M1 power rail (e.g., power rail 412) using an interconnect formed from the second MOL metal layer (CA). For example, the interconnect may couple a first gate in one cell to a second gate in another cell by extending between and making contact with gate contacts on the first and second gates, in which the gate contacts may be formed from the first MOL metal layer (CB). In this respect, the interconnect acts as an electrical bridge between the gate contacts. Since the second MOL metal layer (CA) is formed at a lower level than metal layer M1, the interconnect is able to pass underneath a metal M1 power rail, and therefore does not require a break in the metal M1 power rail.

In certain aspects, one or more transistors may be tied off to provide electrical isolation between semiconductor devices (transistors). In these aspects, a transistor is tied off by coupling the source and gate of the transistor together. This permanently turns off the transistor, allowing the transistor to act as an electrical barrier between semiconductor devices on opposite sides of the transistor.

Figure 12:
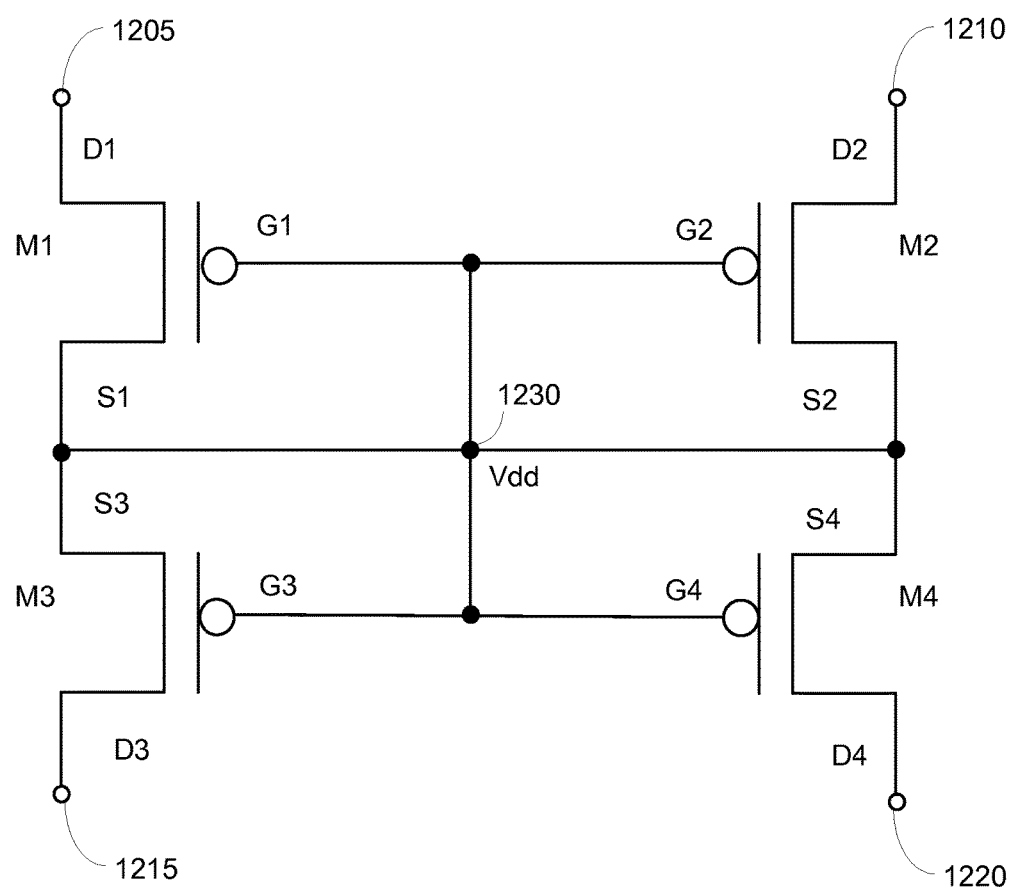
FIG. 12 shows a circuit diagram of multiple transistors, in which the sources and gates of the transistors are tied off to provide an electrical barrier according to certain aspects of the present disclosure.

In this regard, FIG. 12 is a circuit diagram illustrating an example in which transistors M1-M4 are tied off to provide electrical isolation between nodes 1205, 1210, 1215 and 1220. In this example, the gates G1-G4 and sources S1-S4 of the transistors M1-M4 of the transistors M1-M4 are all tied to node 1230, which is coupled to supply voltage Vdd. This effectively turns off transistor M1-M4, providing an electrical barrier between nodes 1205, 1210, 1215 and 1220, which may correspond to the drains D1-D4 of the transistors M1-M4. As a result, a device (e.g., transistor) coupled to one of the nodes 1205, 1210, 1215 and 1220 is electrically isolated from the other nodes 1205, 1210, 1215 and 1220. In the example in FIG. 12, the transistors M1-M4 are p-type field effect transistors (PFETs). However, it is to be appreciated that the transistors M1-M4 may be replaced with n-type field effect transistors (NFETs) with the gates and sources of the NFETs tied to ground.

Figure 13A:
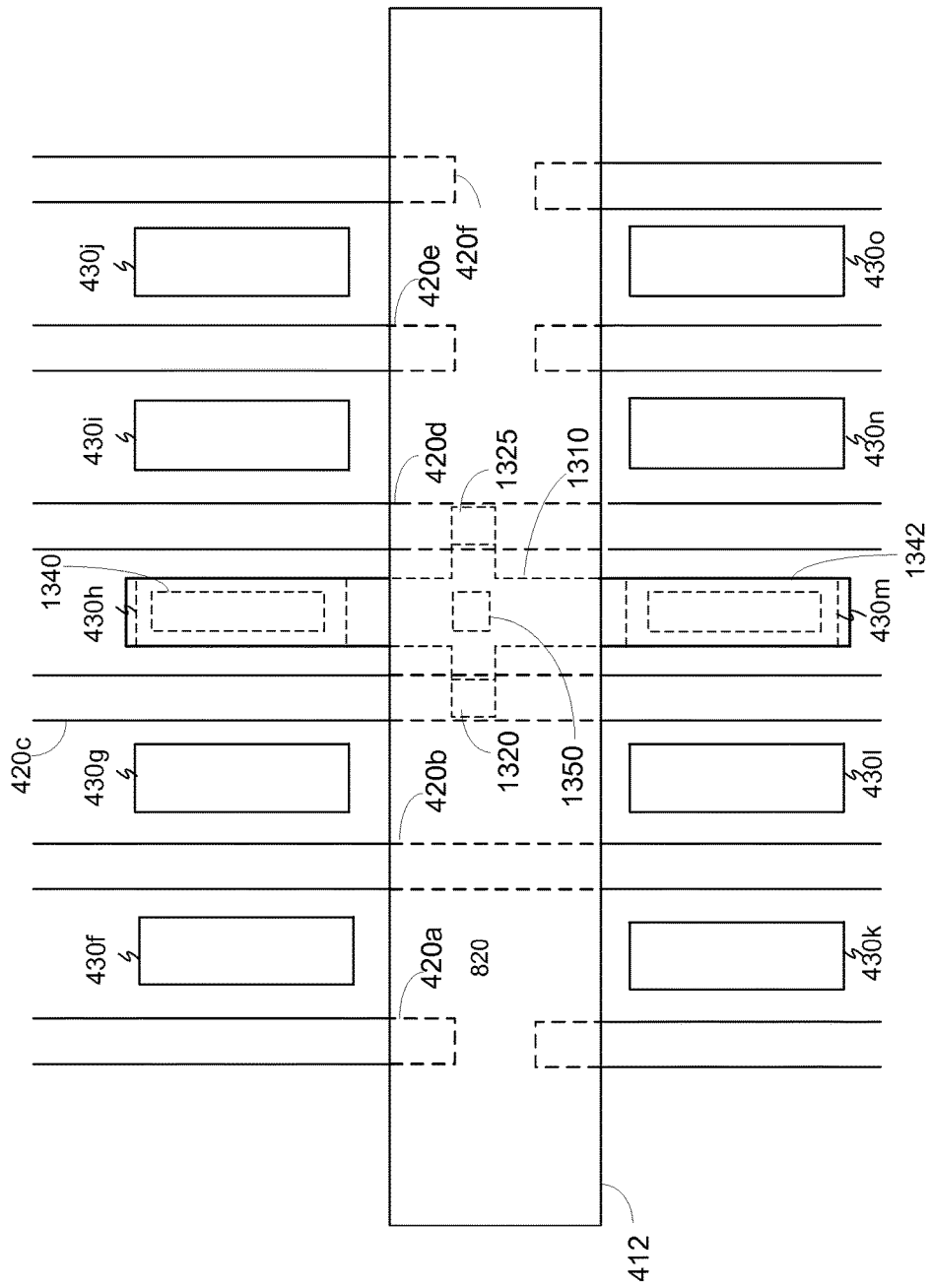
FIGS. 13A and 13B show top views of an interconnect under a metal M1 power rail for implementing the circuit in FIG. 12 according to certain aspects of the present disclosure.
Figure 13B:
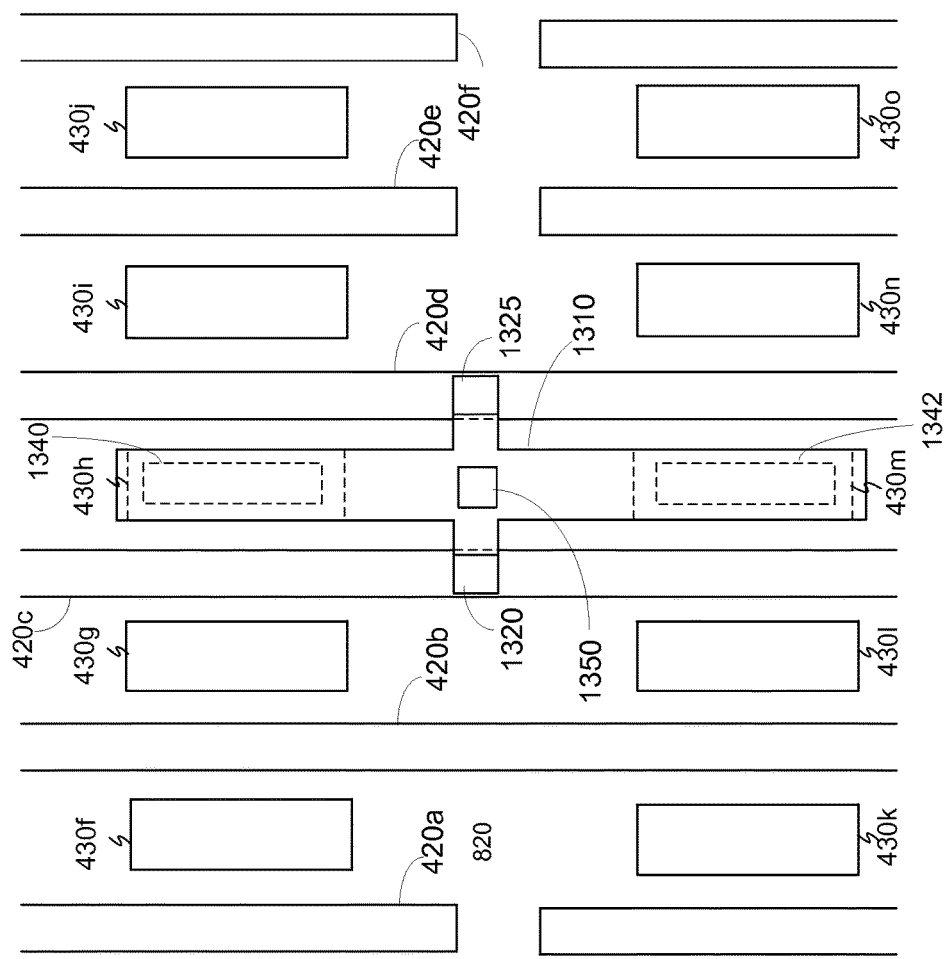

FIGS. 13A and 13B show top views of an exemplary interconnect 1310 that provides routing underneath the second power rail 412 for implementing the exemplary circuit shown in FIG. 12. FIG. 13A shows the interconnect 1310 with the second power rail 412, and FIG. 13B shows the interconnect 1310 with the second power rail 412 removed to provide an unobstructed view of the interconnect 1310. FIG. 14 shows a side view of the interconnect 1310. The interconnect 1310 may be formed from the second MOL metal layer (CA), as discussed further below.

In this example, gate 420*c* and source/drain 430*h* may provide the gate G1 and source S1 of transistor M1, gate 420*c* and source/drain 430*m* may provide the gate G2 and source S2 of transistor M2, gate 420*d* and source/drain 430*h* may provide the gate G3 and source S3 of transistor M3, and gate 420*d* and source/drain 430*m* may provide the gate G4 and source S4 of transistor M4. Thus, gate 420*c* may provide the gates G1 and G2 for both transistors M1 and M2, and gate 420 may provide the gates G3 and G4 for both transistors M3 and M4. Similarly, source/drain 430*h* may provide the sources S1 and S3 for both transistors M1 and M3, and source/drain 430*m* may provide the sources S2 and S4 for both transistors M2 and M4. Sources/drains 430*g*, 430*l*, 430*i* and 430*n* may provide the drains D1-D4, respectively, of the transistors M1-M4.

In this example, the interconnect 1310 extends between and makes contact with gate contacts 1320 and 1325 on gates 420*c* and 420*d*, respectively. As a result, the interconnect 1310 and gate contacts 1320 and 1325 couple the gates G1-G4 of the transistors M1-M4 together. In the example shown in FIG. 14, the interconnect 1310 makes contact with sidewalls of the gate contacts 1320 and 1325.

The interconnect 1310 is also coupled to source/drain 430*h* and source/drain 430*m*. In this example, the interconnect 1310 is coupled to source/drain 430 by source/drain contact 1340 (e.g., TS source/drain contact) disposed between the interconnect 1310 and source/drain 430*h*, and coupled to source/drain 430*m* by source/drain contact 1342 (e.g., TS source/drain contact) disposed between the interconnect 1310 and source/drain 430*m*. In the example shown in FIG. 14, the interconnect 1310 makes contact with the tops of the source/drain contacts 1340 and 1342 (e.g., TS source/drain contacts).

Thus, the interconnect 1310 couples the gates G1-G4 of the transistors M1-M4 together and couples the sources S1-S4 of the transistors M1-M4 together. As a result, the gates G1-G4 and sources S1-S4 of the transistors M1-M4 are all coupled together.

The interconnect 1310 is also coupled to the second power rail 412 by via 1350 disposed between the interconnect 1310 and the second power rail 412. In one example, the second power rail 412 provides supply voltage Vdd and the transistors M1-M4 are PFETs. As a result, in this example, the gates G1-G4 and sources S1-S4 of the transistors M1-M4 are tied to Vdd. This effectively turns off the transistors M1-M4, providing an electrical barrier between the first cell 450 and the second cell 455, and more particularly between sources/drains 430g, 430l, 430i and 430n.

Thus, the interconnect 1310 (which is formed from the second MOL metal layer (CA)) provides routing under the second power supply 412 for tying off the transistors M1-M4 to form an electrical barrier. It is to be appreciated that aspects of the present disclosure are not limited to the example shown in FIGS. 12-14. In general, aspects of the present disclosure may tie off one or more transistors by using an interconnect formed from the second MOL metal layer (CA), in which the interconnect is coupled the gate and source of each transistor. The interconnect may also be coupled to a metal M1 power rail by a via between the interconnect and the power rail. For the example in which the one or more transistors are PFETs, the power rail may provide supply voltage Vdd. For the example in which the one or more transistors are NFETs, the power rail may provide supply voltage Vss.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A semiconductor die, comprising:
   a power rail;
   a first gate;
   a second gate;
   a first gate contact electrically coupled to the first gate, wherein the first gate contact is formed from a first middle of line (MOL) metal layer;
   a second gate contact electrically coupled to the second gate, wherein the second gate contact is formed from the first MOL metal layer; and
   an interconnect formed from a second MOL metal layer, wherein the interconnect is electrically coupled to the first and second gate contacts, the interconnect extends laterally between a sidewall of the first gate contact and a sidewall of the second gate contact, and at least a portion of the interconnect is underneath the power rail, wherein the power rail is formed from an M1 metal layer, and the M1 metal layer is above the first and second MOL metal layers.

2. The semiconductor die of claim 1, wherein the interconnect makes contact with the sidewalls of the first and second gate contacts.

3. The semiconductor die of claim 1, further comprising:
   a source, wherein the interconnect is electrically coupled to the source; and
   a via electrically coupled between the interconnect and the power rail.

4. The semiconductor die of claim 3, further comprising a source contact disposed between the source and the interconnect.

5. The semiconductor die of claim 4, wherein the source contact comprises trench silicide.

6. The semiconductor of claim 3, wherein the source and the first gate are part of a p-type field effect transistor (PFET), and the power rail has a supply voltage of Vdd.

7. The semiconductor die of claim 6, wherein the interconnect ties the source and the first gate together to the power rail to turn off the PFET.

8. The semiconductor of claim 3, wherein the source and the first gate are part of an n-type field effect transistor (NFET), and the power rail is grounded.

9. The semiconductor die of claim 1, further comprising:
   a first source, wherein the first source and the first gate are part of a first transistor;
   a second source, wherein the second source and the second gate are part of a second transistor, and the interconnect is electrically coupled to the first source and the second source; and
   a via electrically coupled between the interconnect and the power rail.

10. The semiconductor die of claim 1, further comprising:
    a source/drain;
    a source/drain contact electrically coupled to the source/drain, wherein the source/drain contact is formed from the second MOL metal layer; and
    a via electrically coupled between the source/drain contact and the power rail.

11. The semiconductor die of claim 8, wherein the interconnect ties the source and the first gate together to the power rail to turn off the NFET.

12. The semiconductor die of claim 1, wherein the interconnect passes over a third gate, and the third gate is between the first and second gates.

13. A semiconductor die, comprising:
    a power rail;
    a first gate;
    a second gate;
    a third gate, wherein the third gate is between the first and second gates;
    a first gate contact electrically coupled to the first gate, wherein the first gate contact is formed from a first middle of line (MOL) metal layer;
    a second gate contact electrically coupled to the second gate, wherein the second gate contact is formed from the first MOL metal layer; and
    an interconnect formed from a second MOL metal layer, wherein the interconnect is electrically coupled to the first and second gate contacts, the interconnect passes over the third gate, and at least a portion of the interconnect is underneath the power rail, wherein the power rail is formed from an M1 metal layer, and the M1 metal layer is above the first and second MOL metal layers.

14. The semiconductor die of claim 13, wherein the interconnect makes contact with sidewalls of the first and second gate contacts.

15. The semiconductor die of claim 13, wherein the first gate is in a first cell, and the second gate is in a second cell.

* * * * *